(12) United States Patent
Laurent et al.

(10) Patent No.: US 11,892,492 B2
(45) Date of Patent: Feb. 6, 2024

(54) MULTI-AXIS TEST EQUIPMENT

(71) Applicant: MILLIWAVE SILICON SOLUTIONS, INC., San Jose, CA (US)

(72) Inventors: JeanMarc Laurent, San Jose, CA (US); Chinh Doan, San Jose, CA (US)

(73) Assignee: Milliwave Silicon Solutions, Inc., San Jose, CA (US)

( * ) Notice: Subject to any disclaimer, the term of this patent is extended or adjusted under 35 U.S.C. 154(b) by 166 days.

(21) Appl. No.: 17/516,633

(22) Filed: Nov. 1, 2021

(65) Prior Publication Data

US 2023/0133841 A1 May 4, 2023

(51) Int. Cl.
*G01R 29/10* (2006.01)
*G01R 29/08* (2006.01)

(52) U.S. Cl.
CPC ......... *G01R 29/10* (2013.01); *G01R 29/0871* (2013.01)

(58) Field of Classification Search
CPC .............. G01R 29/0864; G01R 29/0871; G01R 29/10; G01R 29/105; G01R 31/2822; H01Q 3/267
See application file for complete search history.

(56) References Cited

U.S. PATENT DOCUMENTS

| 2004/0119655 | A1* | 6/2004 | Hunt | .................... | H01Q 1/1228 343/890 |
| 2021/0405103 | A1* | 12/2021 | Salazar Cerreno | .. | H04B 17/102 |

FOREIGN PATENT DOCUMENTS

| CN | 112904096 | A | * | 6/2021 | ........... G01R 1/0408 |
| CN | 113985151 | A | * | 1/2022 | |

OTHER PUBLICATIONS

"MilliBox: mmWave Antenna Test System Demo. Compact anechoic chamber and 3D antenna positioner." YouTube, uploaded by MilliBox, Jul. 31, 2020. Retrieved from https://www.youtube.com/watch?v=GuhB8-k2V2Q (Year: 2020).*

"3D DUT Positioner", Nov. 14, 2019, Microwave Journal. Retrieved from https://www.microwavejournal.com/articles/33169-d-dut-positioner-millibox-gim01 (Year: 2019).*

"MilliBox: mmWave Antenna Test System Demo. Compact anechoic chamber and 3D antenna positioner." YouTube, uploaded by MilliBox, Jul. 31, 2020. Retrieved from https:/Avww.youtube.com/watch?v=GuhB8-k2V2Q (Year: 2020).*

* cited by examiner

*Primary Examiner* — Ab Salam Alkassim, Jr.
*Assistant Examiner* — Leah Rosenberg
(74) *Attorney, Agent, or Firm* — Schwabe, Williamson & Wyatt, P.C.

(57) ABSTRACT

Embodiments herein relate to a testing apparatus for coupling with a device-under-test (DUT). The apparatus may include a base portion configured to couple to a testing platform, wherein the base portion is configured to rotate the DUT around a first axis. The apparatus may further include an arm portion configured to rotate the DUT around a second axis perpendicular to the first axis. The apparatus may further include a platform portion configured to couple to the DUT. Other embodiments may be described and claimed.

17 Claims, 12 Drawing Sheets

MULTI-AXIS TEST EQUIPMENT

BACKGROUND

It may be desirable to test various antennas (referred to herein as device(s)-under-test or "DUTs") in a variety of different configurations or orientations. Specifically, because certain DUTs such as millimeter-wave (mmWave) or Terahertz (THz)-frequency antennas may be formed of, or include, a phased array, it may be desirable to ensure that the phase arrays are appropriately calibrated.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
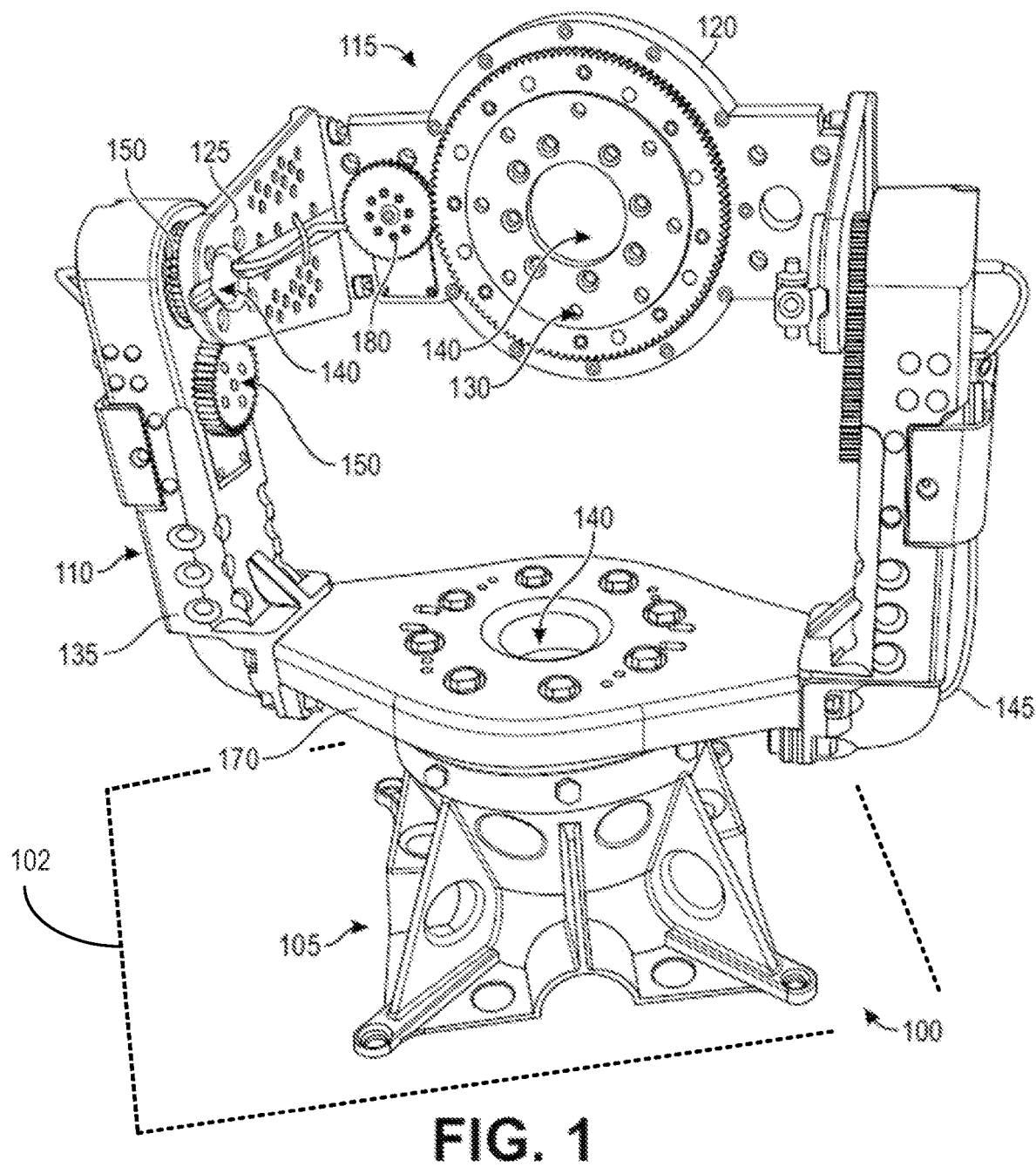
FIG. 1 illustrates a view of an example testing apparatus, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

As previously noted, it may be desirable to test various DUTs (e.g., mmWave or THz-frequency antennas) in a variety of different configurations or orientations. Specifically, a DUT may be a device that radiates electro-magnetic power. It will be understood that although embodiments are described herein with specific reference to mmWave or THz-frequency antennas, in other embodiments the DUT may be a different type of antenna, transmitter, receiver, transceiver/etc. that radiates in the mmWave-range, THz-frequency range, or some other wavelength or frequency range. In some embodiments, the specific frequency range of the DUT may be on the order of between approximately 18 Gigahertz (GHz) and approximately 300 GHz, while in other embodiments the DUT may have a broader frequency range, a narrower frequency range, and/or a different frequency range.

Generally, embodiments herein will be described with respect to the DUT's transmission functionality. Specifically, embodiments and examples will be described with respect to transmission/radiation by the DUT. One or more sensors may be separate from the DUT, and configured to measure one or more parameters of the DUT's radiation such as a received signal strength indicator (RSSI), signal to noise ratio (SNR), error vector magnitude (EVM), bit error rate (BER), or some other parameter. More generally, the one or more sensors may measure a received power level at the intended transmitted frequency when a signal is unmodulated. Based on that measurement, various parameters such as effective isotropic radiated power (EIRP), total radiated power (TRP), or some other parameter may be estimated.

However, in other embodiments the DUT may additionally/alternatively be a receive antenna. In this embodiment, a separate radiation source may be configured to emit one or more signals, and the testing parameters of the DUT may relate to parameters of the DUT's reception.

It may be desirable to measure the radiated power of a DUT in space to verify that the energy is concentrated in the desired spatial direction. Such verification may be desirable during, for example, construction or verification of such a DUT. This radiated direction/energy efficiency verification may be desirable in mmWave and THz radio designs because those designs typically rely on active phase array antenna designs to achieve this power concentration necessary for propagation at the high frequencies associated with mmWave or THz waves. As used herein, the term "phase arrays" is used to refer to clusters of antennas equipped with phase shifters, dynamically controlled by software, which by combining their signal through the phase shifters can direct radiated power in a given spatial direction.

There are at least two techniques that may be used to measure radiation patterns. One such technique is to have a fixed measurement point, and then rotate the DUT. The other technique is to rotate the measurement point around the fixed DUT. Embodiments herein relate to a testing apparatus that employs the former method, that is, rotating the DUT around a fixed measurement point. Specifically, a base portion of the testing apparatus may be attached (e.g., bolted or attached in some other way) to a surface 102 like a lab bench, an anechoic chamber floor, a table, etc. It will be noted that the surface 102 is indicated by a dashed line to provide context, as the specific size and shape of said surface 102 is beyond the scope of the present disclosure. The base portion may include a rotor around a vertical axis, which provides rotation about an Azimuth axis. The base portion may be coupled with an arm portion that, in one embodiment, includes two arms carrying a platform portion above the base portion. The base portion may be configured to rotate the arm portion around the Azimuth axis, and the arm portion may be configured to rotate the platform portion about an Elevation axis that is orthogonal to the Azimuth axis. Finally, the platform portion may include an attachment plate that rotates the DUT around a Polarization axis, which may be coincident with the axis of radiation of the DUT. The Polarization axis may be orthogonal to the Azimuth and Elevation axes.

Therefore, in embodiments the DUT position may be characterized by three angles: The H angle (related to rotation about the Azimuth axis); the V angle (related to rotation about the Elevation axis); and the P angle (related to rotation about the Polarization axis). By the mean of a software controller communicatively coupled with the testing apparatus (or one or more elements thereof), a user may rotate the DUT to any of the above-listed three angles (e.g., around any of the above-listed axes) and make a measurement of the power radiated from and/or received by the DUT at a particular position and/or orientation. Furthermore, the software controller may offer sweep capability. The sweep capability may define a region in space, and a resolution that divides the space into discrete points that are referred to herein as "steps." At each step, the controller may be synchronized with a measurement device that is external to the DUT and/or testing apparatus. The controller and the measurement device together may make a data capture and record it in a table together with coordinates of each point (e.g., coordinates that define the position or orientation of the DUT).

Visualization graphic software communicatively coupled with, or as an element of, the software controller may be used to display, to a user, a multidimensional representation of the energy in the space region surveyed by the sweep. Additionally, in some embodiments the controller code may be provided in source form, and so the physical metrics that may be captured within a sweep may be limitless. This means that in addition to radiated or received power measurements, a user may be capable of augmenting its instrument automation capabilities to capture other metrics, like current consumption, temperature, phase vectors, time of flight, or even full frequency response at each point of the sweep.

FIG. 1 illustrates a view of an example testing apparatus 100, in accordance with various embodiments. It will be understood that the embodiments herein may be described or depicted with respect to specific materials, dimensions, or configurations. However, such materials, dimensions, or configurations are intended as examples of such embodiments, and other embodiments may vary.

The testing apparatus 100 may include a base portion 105. As previously described, the base portion 105 may be configured to attach to a surface such as a surface like a lab bench, an anechoic chamber floor, or a table. Although not shown, the base portion may be configured with one or more motors, gears, or some other type of drive apparatus that is configured to cause rotation around the Azimuth axis. In some embodiments, the drive apparatus may be inside of, partially inside of, or external to but coupled with the base portion 105. In some embodiments, the rotation may be a rotation of at least a portion of the base portion (e.g., a moveable coupling), or a rotation of an element that extends from the base portion such as a platform, a spindle, a gear, or some other element.

The testing apparatus may further include an arm portion 110 that is coupled with the base portion 105. Specifically, the arm portion 110 may be coupled with the base portion 105 such that the base portion 105 rotates the arm portion 110 around the Azimuth axis as described above. In some embodiments, the arm portion 110 may include a plurality of elements such as a horizontal deck 170 that is coupled, either directly or indirectly, with one or more arms 135. Specifically, in some embodiments the arms 135 may be coupled directly with the horizontal deck 170, whereas in other embodiments a spacer may be positioned between the arms 135 and the horizontal deck 170 as described in greater detail below. In some embodiments, although two arms 135 are depicted, in other embodiments the arm portion 110 may have more or fewer arms 135 (e.g., it may be asymmetric).

The testing apparatus 100 may further include a platform portion 115 that is coupled with the arm portion 110. As can be seen in FIG. 1, the arm portion 110 may include one or more arm control gears 150. In some embodiments, one of the arm control gears 150 may be a driver gear, while another of the arm control gears 150 may be a passive rotational gear that is coupled with the platform portion 115. In other words, the driver gear may be coupled with a drive apparatus such as a motor (not shown), and with the driver gear it may rotate the passive rotational gear, which, in turn, rotates the platform portion 115. In other embodiments, the arm control gears 150 may be positioned or coupled in another configuration or arrangement.

When the arm control gears 150 rotate, they may rotate the platform portion 115 around the Elevation axis, as described above. In this manner, the testing apparatus may be configured to rotate a DUT around both the Azimuth axis (via rotation of one or more elements of the base portion 105) and the Elevation axis (via rotation of one or more elements of the arm portion 110).

The platform portion may include various elements such as one or more hands 125 coupled with an arm 135 of the arm portion 110. The hands 125, in turn, may be coupled with a platform 120. The platform 120 may include an attachment plate 130 to which a DUT may couple. The attachment plate 130 may be configured to rotate, and be driven by a platform control gear 180. In this manner, if a DUT is coupled with the attachment plate 130, then the platform 120 (and, specifically the attachment plate 130) may rotate the DUT around the Polarization axis. Similarly to the configuration described above, in some embodiments the platform control gear 180 may be coupled with a drive apparatus such as a motor (not shown), and the platform control gear 180 may drive the rotation of the attachment plate 130. In other embodiments, the platform control gear 180 may not be present, and the attachment plate 130 (or an element thereof) may be directly coupled with the drive apparatus.

The size of the testing apparatus, and particularly the DUT capacity, may be based on an optimal size for mmWave and THz-frequency DUTs. In one embodiment, the attachment plate 130 may be configured to couple with a DUT 27 centimeters (cm) wide, 10 cm thick, and several kilograms in weight. Those dimensions may be desirable for the target DUT in mmWave and THz radio frequency range.

Generally, with respect to DUTs, one antenna critical physical dimension is $\lambda/2$ were $\lambda$ is the DUT wavelength. Because $\lambda=C/f$ where C is the speed of light in meters per second (m/s) and f is the DUT frequency in hertz (Hz), the $\lambda/2$ range may be between approximately 0.5 millimeters (mm) to approximately 8 mm. In some embodiments, antenna elements of a DUT may be typically grouped in arrays from 4 elements to 256 elements. This grouping provides a smallest antenna array dimension of approximately 1 mm×1 mm to approximately 256 mm×256 mm (presuming a square configuration) when an antenna dimension and the space between antenna elements is assumed to be $\lambda/2$. Hence, a DUT capacity of approximately 27 cm may be useful in many test cases. It will be noted that, in some embodiments, the DUT itself at system level may be larger that the antenna array, and so the testing apparatus may be designed modularly so that it may expand in width as described in greater detail below.

As noted above, the testing apparatus 100 may include one or more motors or some other drive apparatus that are configured to cause the rotation of one or more portions of the testing apparatus around one or more axes such as the Azimuth, Elevation, or Polarization axes, for example, through rotation of one or more gears such as the arm control gears 150, the platform control gear 180, or one or more gears or elements of the base portion 105. In some embodiments, one or more of the drive apparatuses may be a smart actuator. As used herein, a smart actuator may be a robotic unit that includes a motor, a power driver, an internal microcontroller, and an absolute position encoder.

Generally, a smart actuator may be considered to be more elaborate than typical antenna positioners. Additionally, because they don't need a lot of power, a smart actuator may be more compact than a typical antenna positioner. The integrated absolute encoder may be desirable because it allows a return feedback on the actual position reached by the motor. When a radiation pattern sweep is executed, the motor position error is not accumulated at each step, and instead it stays constant. Such consistency may be useful for compliance with test-requirements of standards-associated bodies.

Additionally, each motor of a smart actuator may be addressable with a unique identifier (ID) and a daisy chain control wiring made of power and transistor-transistor-logic (TTL) lines. This may be desirable, because in a multi-axis rotating device, routing the cabling for power and control is delicate. As such, having an optimized motor wiring may help achieve this solution.

Finally, the smart actuators may have internal features that may be exposed to the testing apparatus user for enhanced control. For example, the smart actuators may have one or more of current sensing, hardware trigger ports, and a real time clock. Those elements may be used in complex setup with a torque limiter in case of accidental blockage, or for instrument synchronization. In general, the smart actuator features may be useful for expandability/modularity of not only the hardware of the testing apparatus 100, but also for modularity of the software component that may be used to drive the testing apparatus 100.

In many instances, the DUT may need one or more of power signals, control signals, and/or radio frequency (RF) signals and, specifically, wires or routing to carry those signals. Routing those wires from a fixed position on a lab bench to the DUT may be required. However, keeping this wiring in place while the DUT moves 360 degrees (°) on 3 axes may be difficult using legacy solutions. The use of slip rings or rotary joints may be one legacy solution if the RF frequency used by the DUT is low and not too susceptible to loss, and if the number of RF signals transmitted or received by the DUT is small. However, in mmWave and THz applications the frequency is very sensitive to propagation loss, and the number of signals may not be small. As such, slip rings and rotary joints may not be desirable solutions.

Rather than the legacy solution described above, the testing apparatus 100 may include the following solution: Rotation axes of the testing apparatus 100 may be hollow and include passthrough holes such that the wiring can be made as close as possible to the rotation axis without discontinuity or risk of tangling. In addition, many anchor points along the wiring path may be provided such that the DUT wires may be securable by zip ties along the path with a dead loop to provide enough slack for the wire during rotation. This design may allow for a full continuity of the signal from bench to the DUT, hence minimizing cables' propagation losses.

More specifically, in some embodiments, one or more of the base portion 105, arm portion 110, and platform portion 115, or elements thereof, may include one or more passthrough holes such as passthrough holes 140 depicted in FIG. 1. It will be understood that not each and every passthrough hole 140 is labeled in FIG. 1, but only a subset are for the sake of clarity of the Figure. Generally, the passthrough holes 140 may allow for the routing of one or more control wires 145 along the structures of the testing apparatus 100. It will be noted that although a single control wire 145 is labeled in FIG. 1, other control wires may be present that may or may not be depicted in FIG. 1, but are not enumerated for the sake of clarity of the Figure. Additionally, it will be noted that the specific size, location, or orientation of the passthrough holes 140 and/or control wires 145 are depicted in FIG. 1 as one example in one embodiment; however, other embodiments may have variations with respect to size, location, and/or orientation of such elements.

The control wires 145 may supply power, control, and/or data signals to or from the DUT (e.g., between the DUT and a power source, between the DUT and a software controller or monitor, etc.). The control wires may additionally or alternatively supply power or control signals to or from elements of the testing apparatus 100 such as the arm control gears 150, the platform control gear 180, a gear of a drive apparatus that is part of or coupled with the base portion 105, etc. Generally, as described above, the passthrough hole(s) 140 may allow for the control wire(s) 145 to remain communicatively coupled with the DUT and/or the various gears 180/150 while the DUT is rotated around one or more of the Azimuth, Elevation, or Polarization axes.

In the mmWave and THz-frequency domains, antennas such as the above-described DUT may be directional due to their phase array designs and resultant beamforming abilities. Typically, directive antennas may have prominent side lobes that can interfere with proper radiation pattern acquisition. This interference may be because a side lobe may include a reflective surface that may create a significant shadow in the measurement direction. At the mmWave and THz frequencies, most or all metallic surfaces may be reflective, and therefore the risk of having corrupted measurement is high. As a result, the testing apparatus 100 may typically be constructed of non-reflective (typically plastic) materials. One such material that may be used for structural elements like the base portion 105, the horizontal deck 170, arms 135, hands 125, platform 120, etc. may be poly lactic acid (PLA), although other non-metallic or non-reflective materials may be used in other embodiments. Similarly, mechanical parts such as arm control gears 150, platform control gear 180, etc. may be formed of polyoxymethylene (POM), although other non-metallic or non-reflective materials may be used in other embodiments. Typically, PLA has a dielectric constant of approximately 3, and a loss tangent of approximately 0.006, while POM has a dielectric constant of 3.7. These characteristics may result in PLA and/or POM having fewer spurious reflections than may be present in metallic materials. Additionally, PLA may typically be made of plants instead of oil, which may be advantageous from an environmental standpoint.

Figure 2:
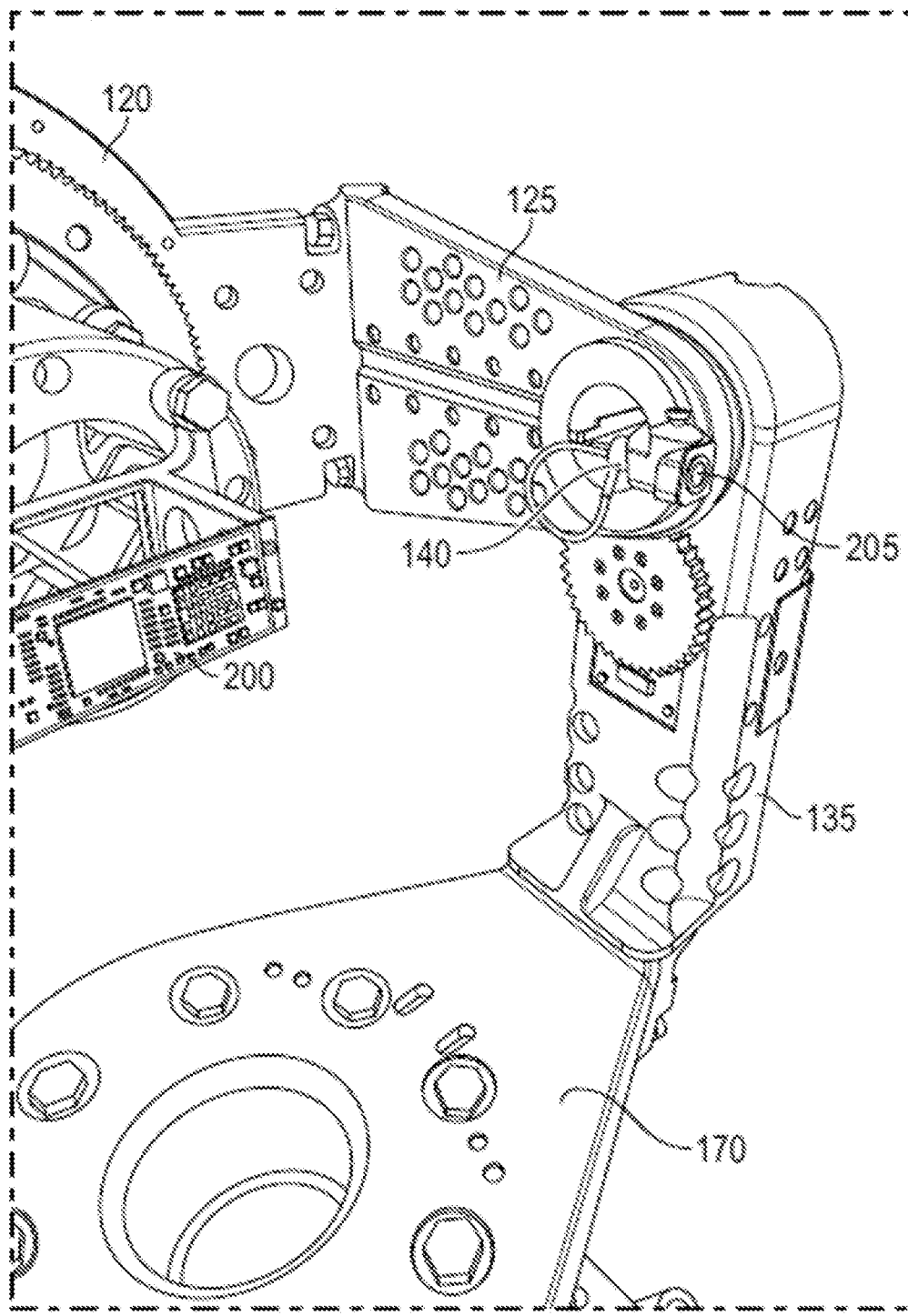
FIG. 2 illustrates an alternative view of an example testing apparatus, in accordance with various embodiments.

FIG. 2 illustrates an alternative view of an example testing apparatus, in accordance with various embodiments. Specifically, in FIG. 2, the DUT 200 may be seen coupled with the platform 120. Additionally, as may be seen the hand 125 may include a passthrough hole 140 at a portion of the hand adjacent to the arm 135, as described above.

Additionally, the testing apparatus 100 may be equipped with a laser crosshair pointer 205 situated parallel to an emission axis (e.g., the Polarization axis) of the DUT 200. In some embodiments, the crosshair pointer 205 may be coupled with the hand 125 as shown, while in other embodiments the crosshair pointer 205 may be coupled with the platform 120 adjacent to the DUT 200. Generally, the crosshair pointer 205 may be a laser pointer or some other form of user-manipulable calibration device. The measuring device that is measuring the emissions of the DUT may include a pointer target. This combination of crosshair pointer 205 and pointer target may allow the user to manually align the fixed measurement device with the DUT 200. When the alignment is done, measurement software may record this position as the reference (0, 0) position. Subsequently all positions are based on this reference point. Because the (0.0) reference calibrated position is recorded, the user may not have to repeat this step for further testing, unless realignment is desired.

Figure 3A:
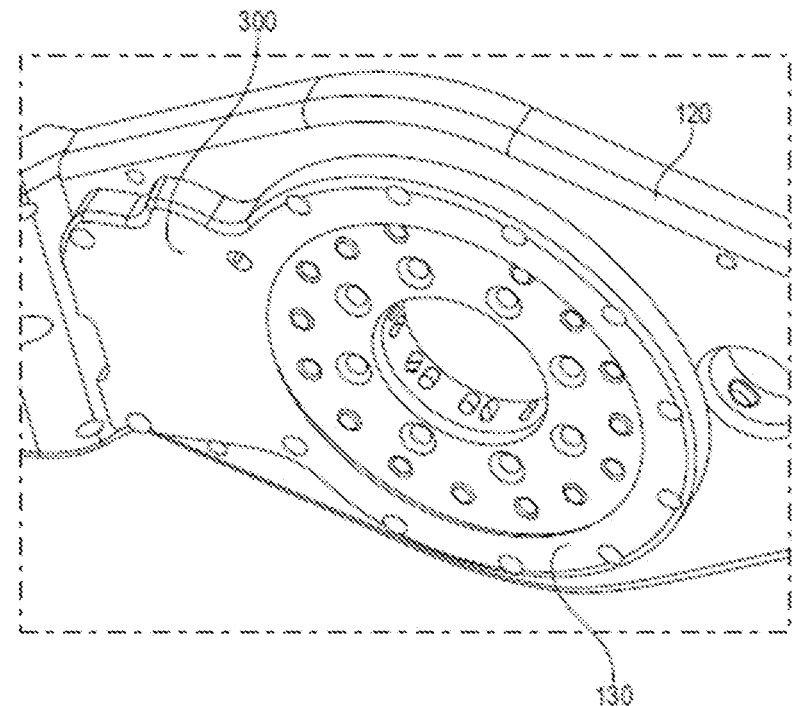
FIGS. 3A and 3B illustrate example views of a platform for use in a platform portion of an example testing apparatus, in accordance with various embodiments.
Figure 3B:
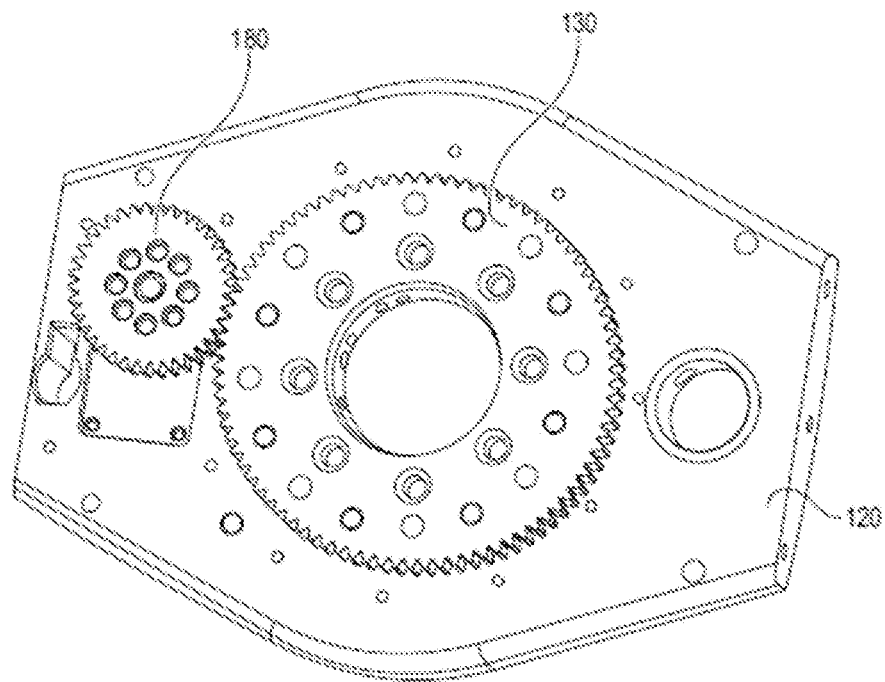

FIGS. 3A and 3B (collectively, FIG. 3) illustrate example views of a platform for use in a platform portion of an example testing apparatus, in accordance with various embodiments. Specifically, FIG. 3 depicts an example of the platform 120 with a rotatable attachment plate 130, as described above. As may be seen in FIG. 3B, the attachment plate 130 may have an outer gear-shape that couples with the platform control gear 180 such that when the platform control gear 180 rotates (for example, if it is driven by a smart actuator as described above), then the attachment plate 130 similarly rotates.

In some embodiments, the platform 120 may include a cover plate 300 as depicted in FIG. 3A. The cover plate 300 may cover at least part of the platform control gear 180 and/or a portion of the attachment plate 130. In this manner, the gear-shapes may be covered such that they do not "catch" stray wires or elements of the DUT.

As described above, the testing apparatus 100 may be formed of several custom parts assembled together to form the different portions of the testing apparatus 100. This assembly design may provide the advantage of a modular design that may be easily customizable without having to rebuild an entirely new testing apparatus. The elements (e.g., the base portion 105 and platform portion 115) may be defined such that new hand designs may be used with the same base portion, and often with the same software. Similarly, the platform DUT mounting is a defined mechanical footprint such that different DUT mounts may be designed to accommodate all kinds of DUTs.

Figure 4A:
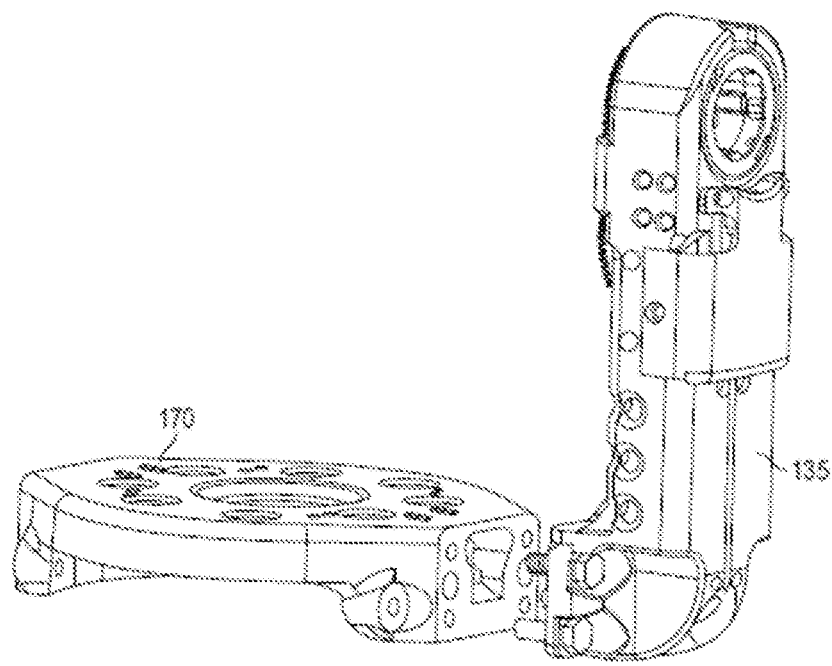
FIGS. 4A and 4B illustrate example elements of an arm portion of a testing apparatus, in accordance with various embodiments.
Figure 4B:
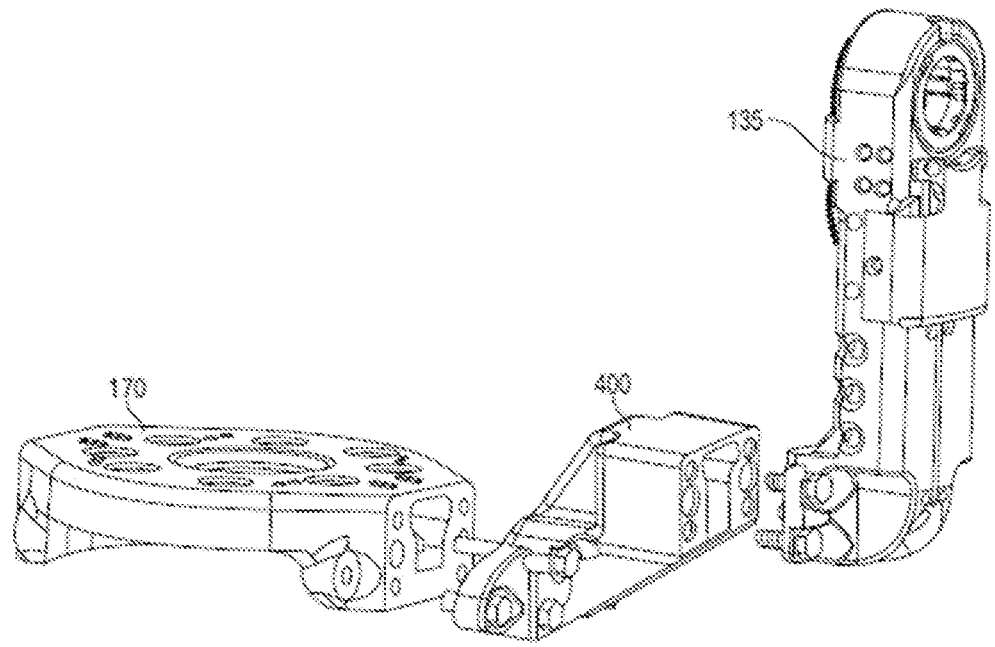

FIGS. 4A and 4B (collectively, "FIG. 4") illustrate example elements of an arm portion of a testing apparatus, in accordance with various embodiments. Specifically, FIG. 4 illustrates an example of the modularity of the testing apparatus 100. In some embodiments, as shown in FIG. 4A, the arm 135 may be directly coupled with the horizontal deck 170. In other embodiments, as shown in FIG. 4B, a spacer 400 may be positioned between the arm 135 and the horizontal deck 170. It will be understood that the illustrated spacer 400 is one example depiction of such a spacer, and other spacers that have a different form factor may be used in other embodiments. Different spacers are described or depicted in different embodiments herein. In some embodiments, the various spacers may be formed of PLA, POM, or some other suitable material as described herein.

Figure 5:
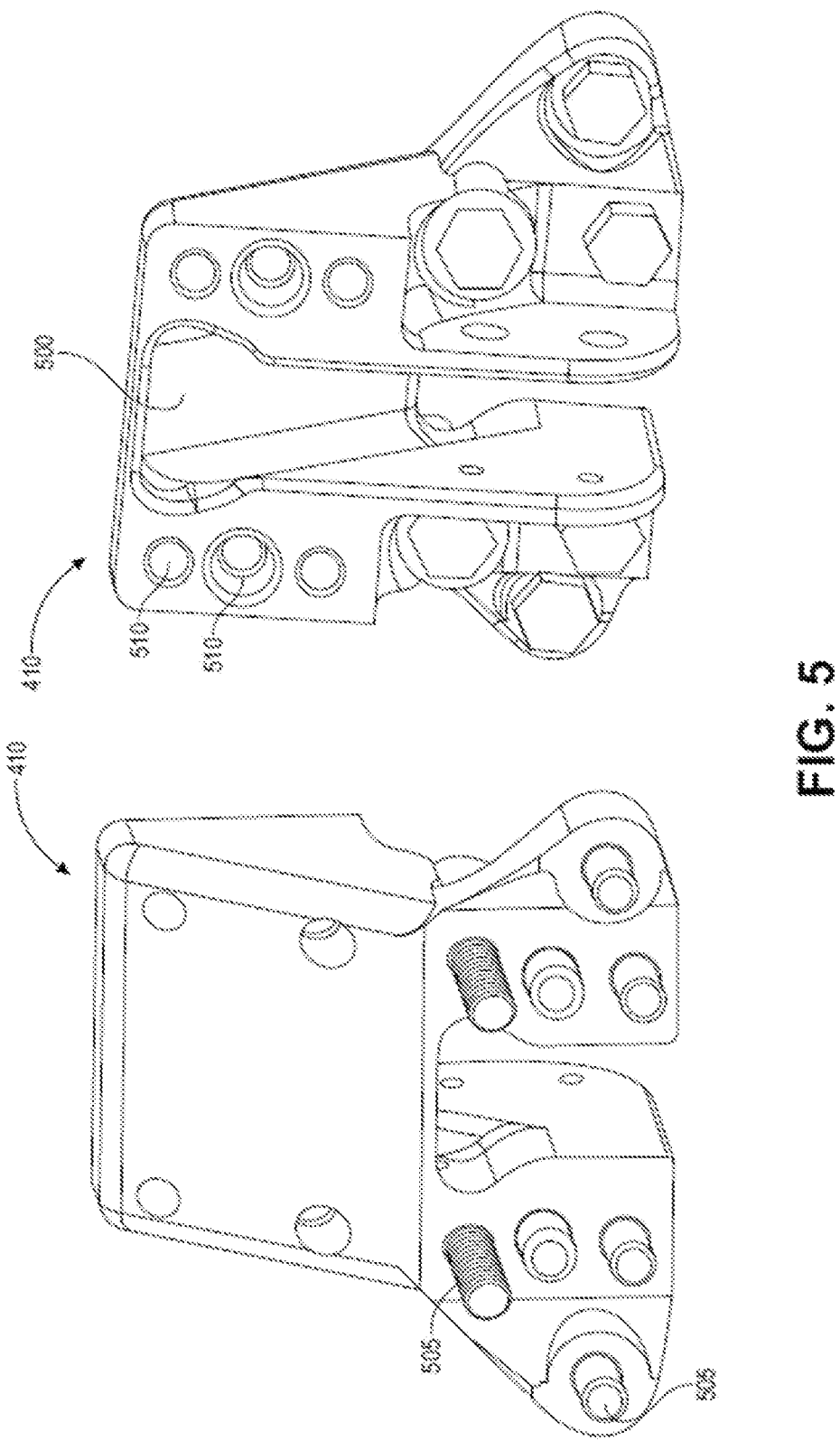
FIG. 5 illustrates example spacers for use in an arm portion of a testing apparatus, in accordance with various embodiments.

FIG. 5 illustrates example spacers for use in an arm portion of a testing apparatus, in accordance with various embodiments. As previously noted, in some embodiments it may be desirable for the structures of the testing apparatus 100 to include one or more passthrough holes such as passthrough holes 140. Similarly, it may be desirable for the spacer 400, or other spacers herein, to include a passthrough hole 500 as depicted in FIG. 5. Additionally, as shown in FIGS. 4 and 5, the spacer 400 may have a variety of posts 505 or holes 510, which may be used to couple with the horizontal deck 170 and/or the arm 135.

Figure 6:
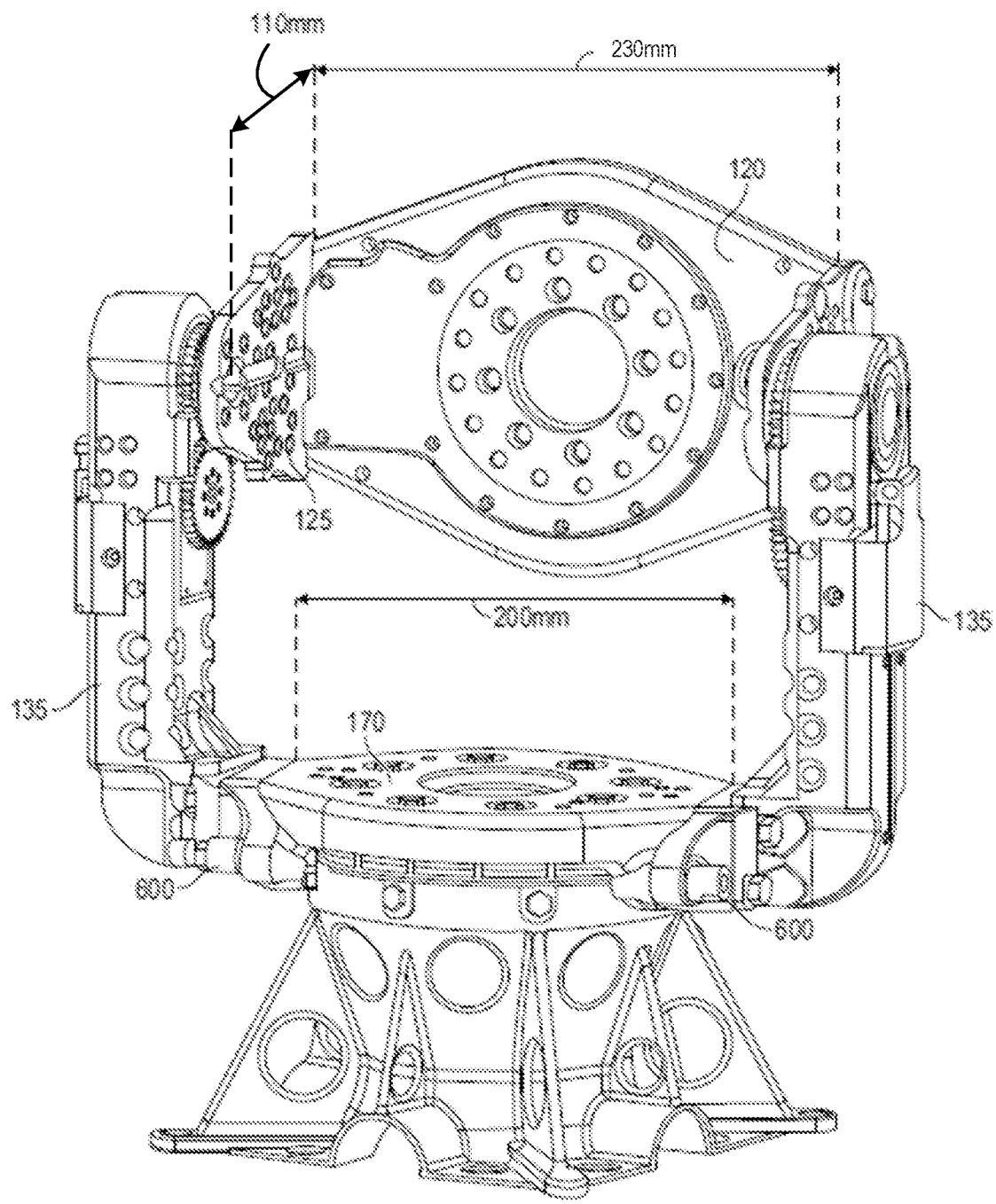
FIG. 6 illustrates a view of a configuration of an example testing apparatus, in accordance with various embodiments.

FIG. 6 illustrates a view of a configuration of an example testing apparatus, in accordance with various embodiments. In this embodiment, the platform 120 may have a width of approximately 230 mm. Such a width may be based on, for example, the necessary width required by the attachment plate and/or platform control gear as previously described. In this embodiment, the hand 125 may have a depth of approximately 110 mm.

In various embodiments, the horizontal deck 170 may only have a width of approximately 200 mm. Therefore, in order to accommodate the extra width of the platform 120, two spacers 600 may be positioned between the arms 135 and the horizontal deck 170. In this embodiment, each spacer 600 may be approximately 15 mm wide.

Figure 7:
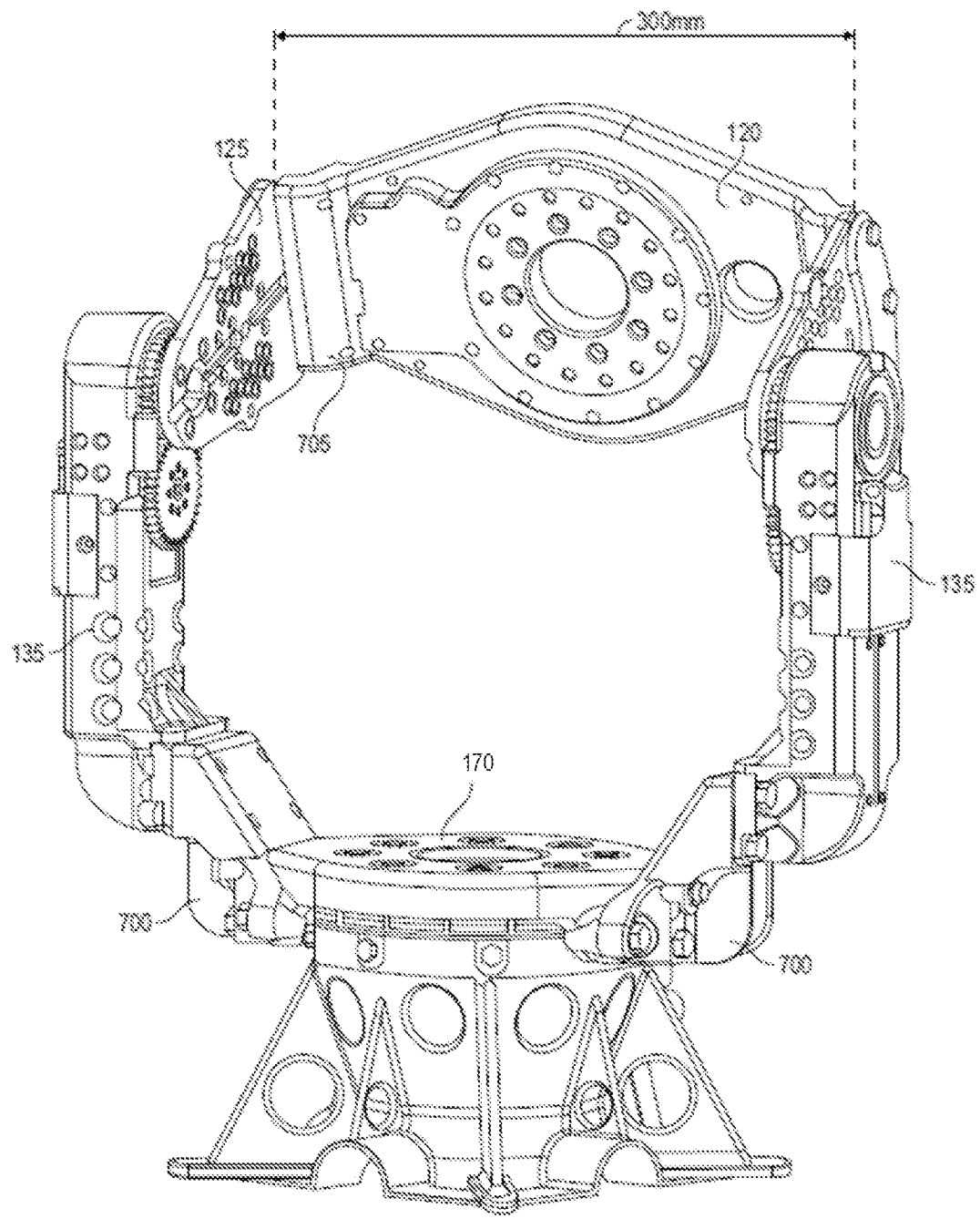
FIG. 7 illustrates a view of an alternative configuration of an example testing apparatus, in accordance with various embodiments.

FIG. 7 illustrates a view of an alternative configuration of an example testing apparatus, in accordance with various embodiments. In this embodiment, the overall width desired between the two arms 135 may be approximately 300 mm. Therefore, in this embodiment shims 705 may be placed between the platform 120 (which may have a width of approximately 230 mm) and the hands 125. Each of the shims 705 may have a width of approximately 35 mm. Similarly, different spacers 700 may be positioned between the horizontal deck 170 and the arms 135. In this embodiment, the spacers 700 may have a width of approximately 50 mm.

Figure 8:
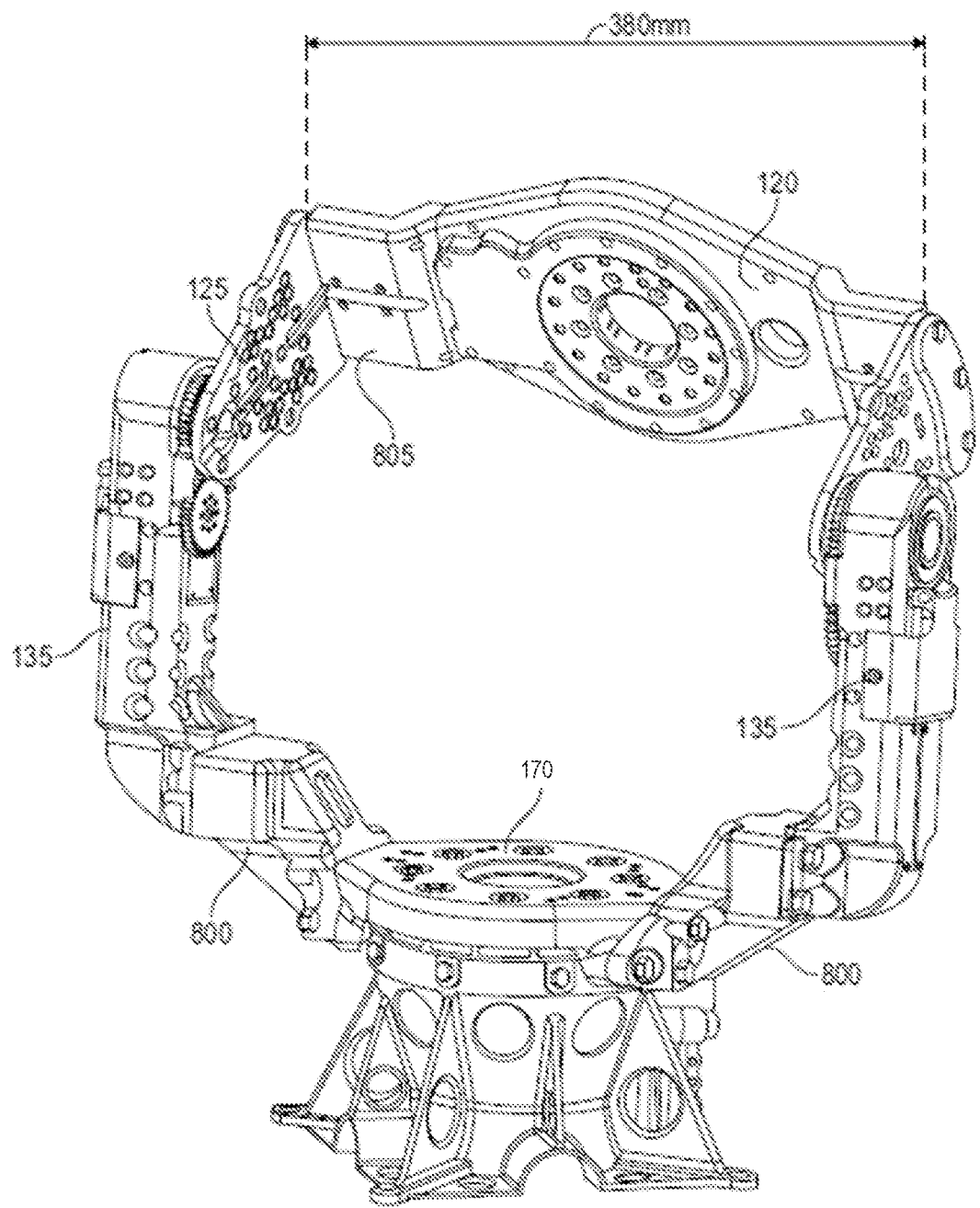
FIG. 8 illustrates a view of an alternative configuration of an example testing apparatus, in accordance with various embodiments.

FIG. 8 illustrates a view of an alternative configuration of an example testing apparatus, in accordance with various embodiments. In this embodiment, the overall width desired between the two arms 135 may be approximately 380 mm. Therefore, in this embodiment shims 805 may be placed between the platform 120 and the hands 125. Each of the shims may have a width of approximately 75 mm. Similarly, different spacers 800 may be positioned between the horizontal deck 170 and the arms 135. In this embodiment, the spacers 800 may have a width of approximately 70 mm.

It will be noted that the shims 705 and 805 may further provide a depth offset (e.g., an offset that is parallel to the hand 125). Such an offset may be desirable for DUTs with a larger form factor (which may drive the desire for increased width of the platform portion), and allow the DUT to still remain relatively centered with respect to the Azimuth and Elevation axes of rotation.

Figure 9:
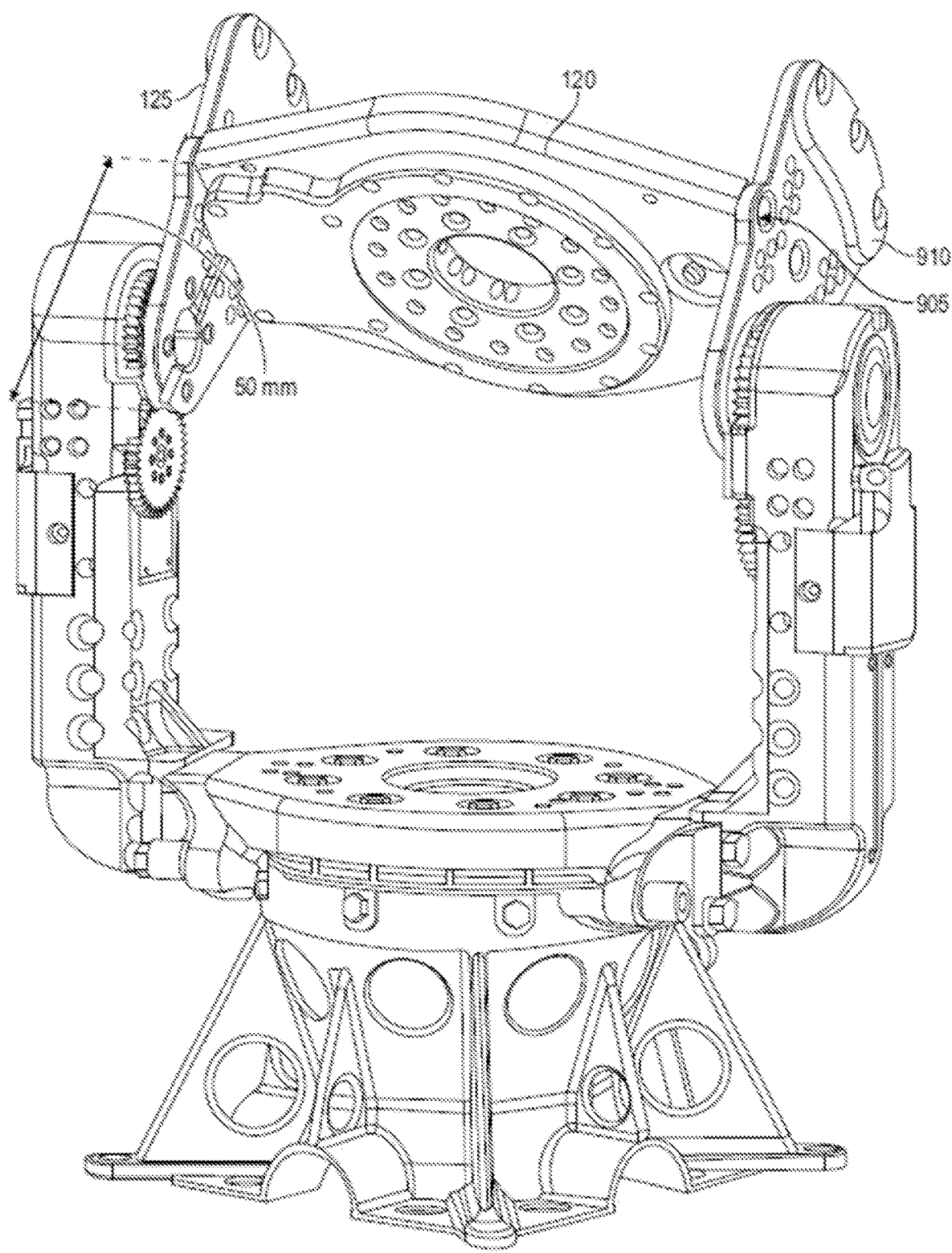
FIG. 9 illustrates a view of an alternative configuration of an example testing apparatus, in accordance with various embodiments.

FIG. 9 illustrates a view of an alternative configuration of an example testing apparatus, in accordance with various embodiments. In this embodiment, the depth of the platform 120 may be adjusted. Specifically, the hand 125 may have two (or more) sets of connectors to which the platform 120 may be coupled, for example, the connectors 910 and the mid-hand connectors 905. The connectors 905/910 may allow for the platform 120 to be coupled in a variety of ways, such as with pins, screws, brackets, etc. When the platform 120 is coupled to the connectors 910, the depth (e.g., the distance of the platform from the Elevation axis) of the platform 120 may be approximately 110 mm as depicted in FIG. 6. However, when the platform 120 is coupled to the mid-hand connectors 905, the depth of the platform 120 may be approximately 50 mm. Adjusted the depth of the platform 120 may be desirable to allow for centering of the DUT around one or more of the Azimuth and Elevation axes.

Figure 10:
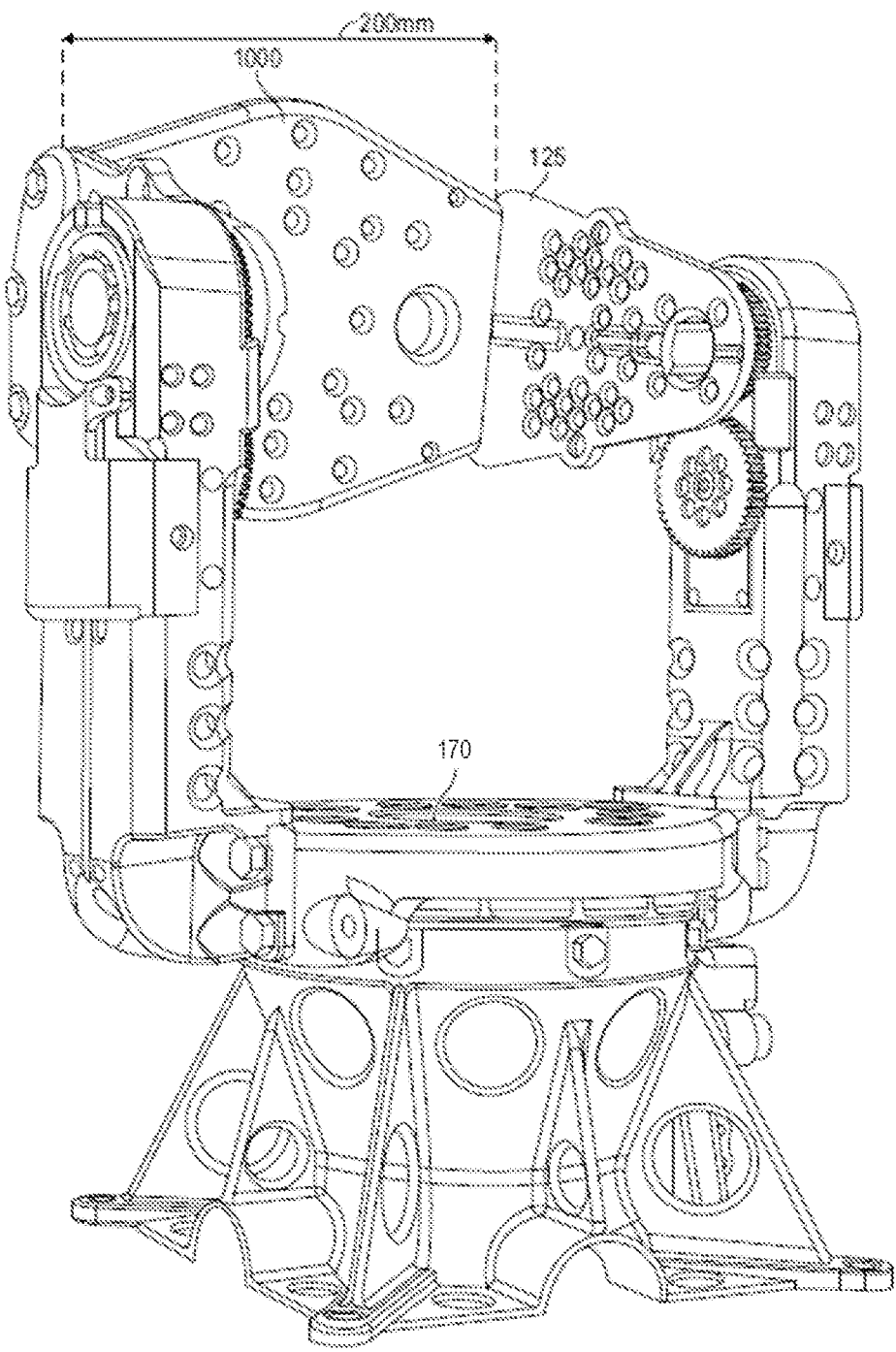
FIG. 10 illustrates a view of an alternative configuration of an example testing apparatus, in accordance with various embodiments.

FIG. 10 illustrates a view of an alternative configuration of an example testing apparatus, in accordance with various embodiments. In this embodiment, it may be desirable for the distance between the hands 125 to be approximately 200 mm. Therefore, platform 1000 may be used, which has a width of approximately 200 mm. In this embodiment, the elements required to rotate the DUT around the Polarization axis (e.g., the attachment plate 130, the platform control gear 180, etc.) may not be present. As described above, in some embodiments such elements may require a width of approximately 230 mm. However, by removing those elements, a smaller platform 1000 may be used, which may have the same approximate width as horizontal deck 170. However, it will be noted that these elements may not be present in other embodiments (e.g., in embodiments with a greater width), for example, if they are not desired, if they alter the desired position of the DUT, if the inclusion of the elements is cost prohibitive, etc. Alternatively, in some embodiments the elements such as the attachment plate 130 or platform control gear 180 may have a smaller form factor, which may be used in a platform with a width of approximately 200 mm.

It will be noted that the above-described dimensions are intended as examples. Other embodiments may have additional or alternative shims or spacers, which may have different widths. In some embodiments, instead of a single shim or spacer between two elements, a plurality of shims with a given length (e.g., 10 mm, 20 mm, 5 mm, etc.) may be mixed or matched to provide the desired spacing. In some embodiments, the described depth offset of the shims may be greater, be lesser, or not exist. In some embodiments, rather than two symmetrical shims or spacers, the shims or spacers may be asymmetric such that the platform is off-center. Other variations may be present in other embodiments and highlight an advantage of the modular testing apparatus 100, in that a user may be able to provide a number of variations to suit particular use cases of a particular DUT.

Figure 11:
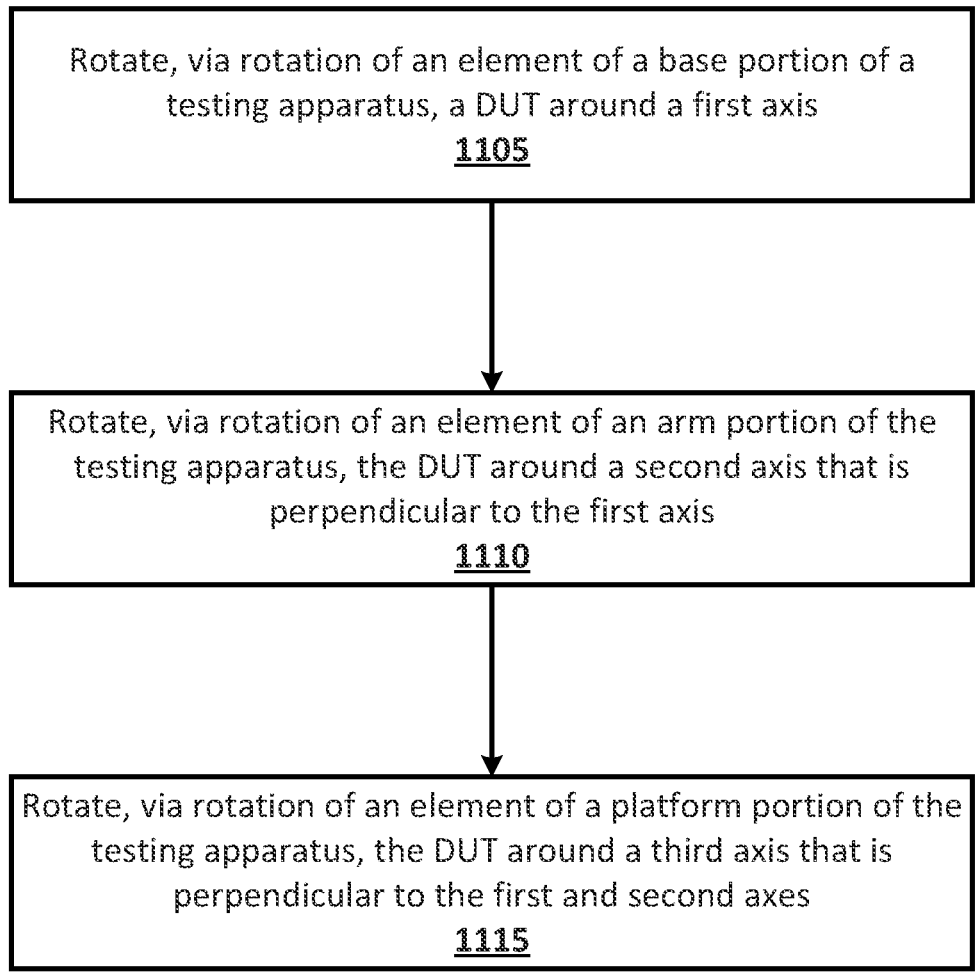
FIG. 11 illustrates an example technique related to use of an example testing apparatus, in accordance with various embodiments.

FIG. 11 illustrates an example technique related to operation of a testing apparatus such as testing apparatus 100, in accordance with various embodiments. While the blocks are illustrated in a particular sequence, the sequence can be modified. For example, some blocks can be performed before others, while some blocks can be performed simultaneously with other blocks. In general, the technique may be performed by one or more software and/or hardware controllers, as described in greater detail below with respect to FIG. 12, while in other embodiments the technique may be performed by additional or alternative elements, processors, logic, etc.

The technique may include rotating, at 1105, via rotation of an element of a base portion of a testing apparatus such as base portion 105 of testing apparatus 100, a DUT such as DUT 200 around a first axis such as the Azimuth axis described above. The technique may further include rotating, at 1110, via rotation of an element of an arm portion such as arm portion 110 of the testing apparatus 100, the DUT around a second axis such as the Elevation axis that is perpendicular to the first axis. The technique may further include rotating, at 1115, via rotation of an element of a platform portion of a testing apparatus such as platform portion 115 of testing apparatus 100, the DUT around a third axis such as the Polarization axis that is perpendicular to the first and second axes.

The flowchart of FIG. 11 can be performed partially or wholly by software providing in a machine-readable storage medium (e.g., memory). The software is stored as computer-executable instructions (e.g., instructions to implement any other processes discussed herein). Program software code/instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with the flowchart (and/or various embodiments) are executed by the processor system.

In some embodiments, the program software code/instructions associated with the flowchart (and/or various embodiments) are stored in a computer-executable storage medium and executed by the processor. Here, the computer-executable storage medium is a tangible machine-readable medium that can be used to store program software code/ instructions and data that, when executed by a computing device, cause one or more processors to perform a method(s) as may be recited in one or more accompanying claims directed to the disclosed subject matter.

The tangible machine-readable medium may include storage of the executable software program code/instructions and data in various tangible locations, including for example read-only memory (ROM), volatile random-access memory (RAM), non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions (associated with the flowchart and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines, or other sequences of instructions or organization of sequences of instructions, by way of example. Thus, it is not required that the data and instructions be on a tangible machine-readable medium in entirety at a particular instance of time.

Examples of the tangible computer-readable media include but are not limited to recordable and non-recordable type media such as volatile and non-volatile memory devices, read-only memory (ROM), random-access memory (RAM), flash memory devices, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical, or other forms of propagating signals, such as carrier waves, infrared signals, digital signals, etc. through such tangible communication links.

In general, tangible machine-readable medium includes any tangible mechanism that provides (e.g., stores and/or transmits in digital form, e.g., data packets) information in a form accessible by a machine (e.g., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, a processor-based system is in a form of or included within a PDA (personal digital assistant), a cellular phone, a notebook computer, a tablet, a game console, a set-top box, an embedded system, a TV (television), a personal desktop computer, etc. Alternatively, the traditional communication applications and subsidized application(s) may be used in some embodiments of the disclosed subject matter.

Figure 12:
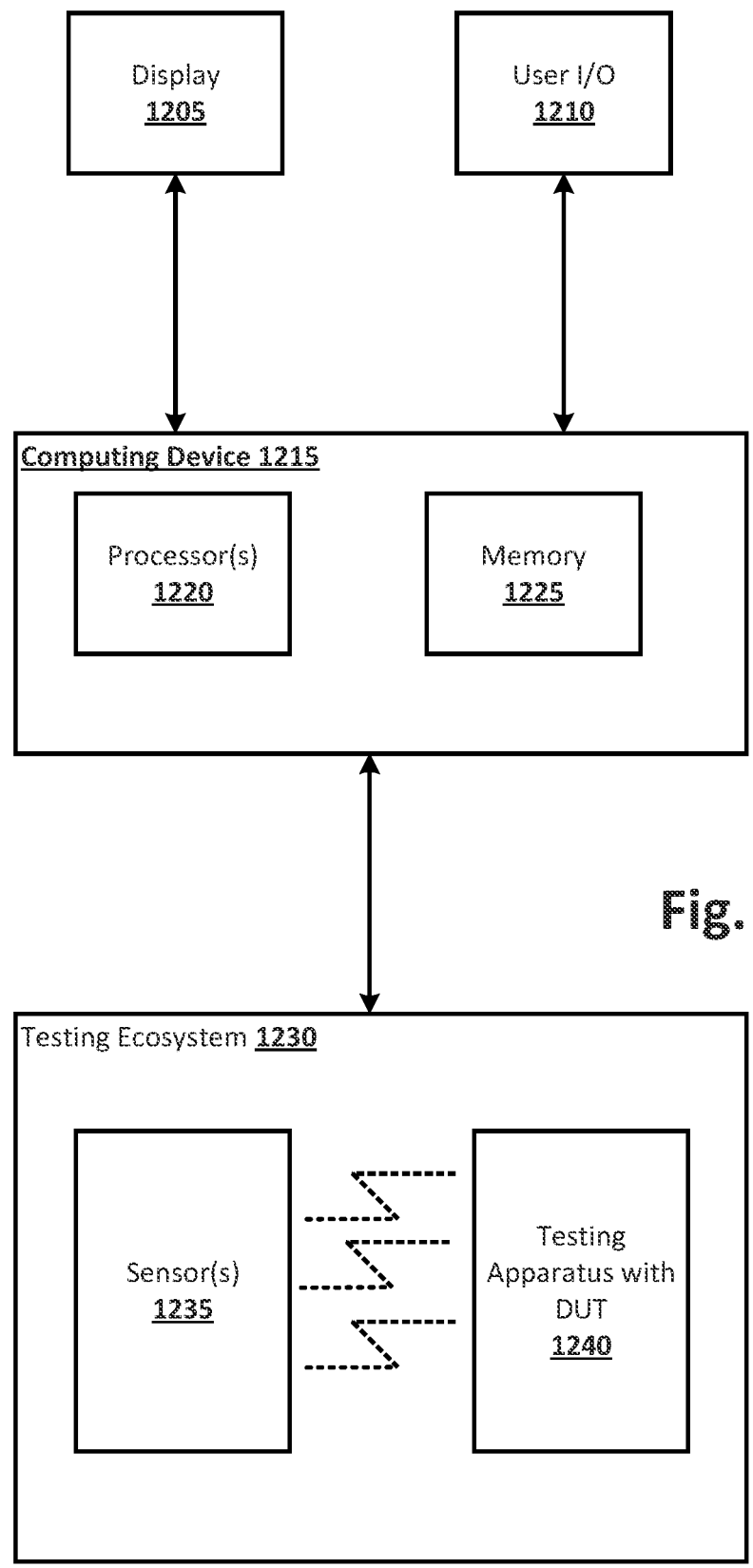
FIG. 12 illustrates an example configuration of a system that includes an example testing apparatus, in accordance with various embodiments.

FIG. 12 illustrates an example configuration of a system that includes an example testing apparatus, in accordance with various embodiments. It will be understood that certain components are shown generally, and not all components of the overall system are shown in FIG. 12.

In some embodiments, computing device 1215 represents an appropriate computing device, such as a computing tablet, a mobile phone or smartphone, a laptop, a desktop, an Internet-of-Things (IOT) device, a server, a wearable device, a set-top box, a wireless-enabled e-reader, or the like.

In some embodiments, computing device 1215 includes processor 1220. Processor 1220 can include one or more physical devices, such as microprocessors, application processors, microcontrollers, programmable logic devices, processing cores, or other processing means. The processing operations performed by processor 1220 include the execution of an operating platform or operating system on which applications and/or device functions are executed. The processing operations include operations related to I/O (input/output) with a human user or with other devices, operations related to power management, operations related to connecting computing device 1215 to another device, and/or the like. The processing operations may also include operations related to audio I/O and/or display I/O.

In some embodiments, computing device 1215 includes memory 1225 coupled to processor 1220. Memory 1225 includes memory devices for storing information in computing device 1215.

Memory can include nonvolatile (state does not change if power to the memory device is interrupted) and/or volatile (state is indeterminate if power to the memory device is interrupted) memory devices. Memory device 1225 can be a dynamic random-access memory (DRAM) device, a static random-access memory (SRAM) device, flash memory device, phase-change memory device, or some other memory device having suitable performance to serve as process memory. In one embodiment, memory 1225 can operate as system memory for device 1215, to store data and instructions for use when the one or more processors 1220 execute an application or process. Memory 1225 can store application data, user data, music, photos, documents, or other data, as well as system data (whether long-term or temporary) related to the execution of the applications and functions of device 1215.

Elements of various embodiments and examples are also provided as a machine-readable medium (e.g., memory 1225) for storing the computer-executable instructions (e.g., instructions to implement any other processes discussed herein). The machine-readable medium (e.g., memory 1225) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, the computing device may include or be coupled to a display 1205, which may be or include hardware (e.g., display devices) and software (e.g., drivers) components that provide a visual and/or tactile display for a user to interact with computing device 1215. Display 1205 may include a display interface, a display screen, and/or hardware device used to provide a display to a user. In some embodiments, display 1205 includes a touch screen (or touch pad) device that provides both output and input to a user. In an example, display 1205 may communicate directly with the processor 1220. Display 1205 can be one or more of an internal display device, as in a mobile electronic device or a laptop device or an external display device attached via a display interface (e.g., DisplayPort, etc.).

The computing device 1215 may further include, or be coupled to, one or more user input/output (I/O) devices 1210 through which a user may provide or receive additional information or feedback. Such devices may include input devices such as a mouse, a trackpad, a trackball, a keyboard, etc. Such devices may additionally or alternatively include output devices such as additional/alternative displays, audio output (e.g., speakers), haptic feedback, etc.

The computing device 1215 may be coupled with the testing ecosystem 1230. The testing ecosystem 1230 may include a testing apparatus with a DUT 1240. The testing apparatus may be similar to, for example, testing apparatus 100 described above, or some other testing apparatus described herein. The DUT may be similar to, for example, DUT 200 described above or some other DUT described herein. The testing apparatus with the DUT 1240 may optionally be communicatively coupled with one or more sensors 1235. In one embodiment, the sensor(s) 1235 may be configured to receive, measure, or otherwise process one or more signals emitted from the DUT as described above. In another embodiment, the sensor(s) 1235 may be replaced by some form of emitter that is configured to emit one or more signals such as a mmWave test signal, a THz-frequency test signal, or some other test signal. Such a configuration may be useful if the DUT is configured with receive functionality that is under test. In another embodiment, the sensor(s) 1235 may not be present if the DUT is, for example, a transceiver with radar-functionality. It will be understood that these are example embodiments and other variations may be present in other implementations or embodiments.

Generally, the testing ecosystem 1230 may be an ecosystem that limits interference between the sensor(s) 1235 and the test apparatus/DUT 1240. Such an ecosystem may be or include an anechoic chamber or some other type of chamber or ecosystem.

In some embodiments, the testing apparatus 100, the DUT 200, and/or the testing apparatus with DUT 1240 may be controlled by a software controller that is coded in Python and available in source code. Such a software controller may be a part of, or located in, processor(s) 1220. The software controller may provide motion functions as well as all sweep functions. Additionally, the software controller may open a virtual instrument software architecture (VISA) interface that may be used for instrument automation. Therefore, the user of the testing apparatus 100 may be able to integrate their own tools by mapping the reference commands to their own measuring instrument(s). Additionally, the user may be able to integrate their own controller for their DUT. For example, if the DUT has a Python controller, the user may be able to integrate the motion of the testing apparatus 100 and the DUT capabilities in a single test setup.

This functionality may be useful for radar-related DUTs, for example, where the DUT measures its own performance (by sending a pulse and receiving an echo). Only the DUT itself may be able to sense its performance, because it is not measured by an external device. As a result, it may be desirable for the user to have the ability to control the DUT and the testing apparatus 100 under a single interface, and record the results in a single table of position/performance metrics at many points in space.

Another approach to radiation measurement is using on-the-fly triggered capture. The advantage of this technique is mainly its speed. Specifically, on-the-fly triggered capture may replace a stop-and-go pattern of: move to a target point, stop to the point, make a measurement capture, move to next point. Rather, the on-the-fly method is based on a direct motion from start point A to stop point B at a given travel speed, and triggering captures at regular interval of time, like stop motion. This technique may be time-efficient because the 3D positioner step time is mainly accelerating and stopping, especially when the steps are very small, and therefore the motion may never reach its full speed. With an on-the-fly capture, the 4D positioner may reach its full speed and carry on its motion uninterrupted along the way. For this, the testing apparatus 100 may feature a trigger input and output signal, which may be used to synchronize the capture of the instrument with the motion. In some embodiments, this feature may be software configurable by the user from simple timed base triggers to more accurate position base triggers. On the reverse, it may allow the instrument to control the motion of the 4D positioner while its acquisition is occurring.

Some non-limiting Examples of various embodiments are presented below.

Example 1 includes a testing apparatus for coupling with a device-under-test (DUT), wherein the apparatus comprises: a base portion configured to couple to a testing platform, wherein the base portion is configured to rotate the DUT around a first axis; an arm portion configured to rotate the DUT around a second axis perpendicular to the first axis; and a platform portion configured to couple to the DUT.

Example 2 includes the testing apparatus of example 1, or some other example herein, wherein the DUT is a millimeter-wave (mmWave) antenna or a terahertz (Thz)-frequency antenna.

Example 3 includes the testing apparatus of example 1, or some other example herein, wherein the first axis is an Azimuth axis and the second axis is an Elevation axis.

Example 4 includes the testing apparatus of example 1, or some other example herein, wherein the arm portion is coupled with the base portion and the platform portion such that the platform portion is coupled with the base portion via the arm portion.

Example 5 includes the testing apparatus of any of examples 1-4, or some other example herein, wherein the arm portion has a width that is selectively adjustable.

Example 6 includes the testing apparatus of example 5, or some other example herein, wherein the width of the arm portion is adjustable based on the insertion or removal of a spacer between elements of the arm portion.

Example 7 includes the testing apparatus of example 6, or some other example herein, wherein the spacer includes a passthrough hole configured to allow a wire that is to be communicatively coupled to the DUT to pass through from one side of the spacer to another side of the spacer.

Example 8 includes the testing apparatus of any of examples 1-4, or some other example herein, wherein an element of the arm portion includes a passthrough hole configured to allow a wire that is to be communicatively coupled to the DUT to pass through from one side of the element of the arm portion to another side of the element of the arm portion.

Example 9 includes the testing apparatus of any of examples 1-4, or some other example herein, wherein an element of the platform portion includes a passthrough hole configured to allow a wire that is to be communicatively coupled to the DUT to pass through from one side of the element of the platform portion to another side of the element of the platform portion.

Example 10 includes the testing apparatus of example 9, or some other example herein, wherein the passthrough hole is adjacent to an area where the arm portion is coupled with the platform portion.

Example 11 includes the testing apparatus of any of examples 1-4, or some other example herein, wherein the platform portion includes an attachment plate that is to couple to the DUT.

Example 12 includes the testing apparatus of example 11, or some other example herein, wherein the attachment plate includes an actuator that is to rotate the DUT around a third axis that is perpendicular to the first and second axes.

Example 13 includes the testing apparatus of example 12, or some other example herein, wherein the third axis is a Polarization axis.

Example 14 includes the testing apparatus of any of examples 1-4, or some other example herein, wherein the platform portion is adjustable such that an element of the platform portion that is to attach to the DUT is movable along a third axis that is perpendicular to the first and second axes.

Example 15 includes an apparatus comprising: a testing platform; and a testing apparatus to couple to a device-under-test (DUT) that includes a millimeter-wave (mm-Wave) antenna or a terahertz (Thz)-frequency antenna, wherein the apparatus comprises: a base portion coupled to the testing platform, wherein the base portion is configured to rotate the DUT around a first axis; an arm portion configured to rotate the DUT around a second axis perpendicular to the first axis; and a platform portion configured to couple to the DUT, wherein the platform portion is configured to rotate the DUT around a third axis that is perpendicular to the first and second axes.

Example 16 includes the apparatus of example 15, or some other example herein, wherein the first axis is an Azimuth axis and the second axis is an Elevation axis.

Example 17 includes the apparatus of example 15, or some other example herein, wherein the arm portion is coupled with the base portion and the platform portion such that the platform portion is coupled with the base portion via the arm portion.

Example 18 includes the apparatus of any of examples 15-17, or some other example herein, wherein the arm portion has a width that is selectively adjustable.

Example 19 includes the apparatus of example 18, or some other example herein, wherein the width of the arm portion is adjustable based on the insertion or removal of a spacer between elements of the arm portion.

Example 20 includes the apparatus of example 19, or some other example herein, wherein the spacer includes a passthrough hole configured to allow a wire that is to be communicatively coupled to the DUT to pass through from one side of the spacer to another side of the spacer.

Example 21 includes the apparatus of any of examples 15-17, or some other example herein, wherein an element of the arm portion includes a passthrough hole configured to allow a wire that is to be communicatively coupled to the DUT to pass through from one side of the element of the arm portion to another side of the element of the arm portion.

Example 22 includes the apparatus of any of examples 15-17, or some other example herein, wherein an element of the platform portion includes a passthrough hole configured to allow a wire that is to be communicatively coupled to the DUT to pass through from one side of the element of the platform portion to another side of the element of the platform portion.

Example 23 includes the apparatus of example 22, or some other example herein, wherein the passthrough hole is adjacent to an area where the arm portion is coupled with the platform portion.

Example 24 includes the apparatus of any of examples 15-17, or some other example herein, wherein the platform portion includes an attachment plate that is to couple to the DUT.

Example 25 includes the apparatus of example 24, or some other example herein, wherein the attachment plate includes an actuator that is to rotate the DUT around the third axis.

Example 26 includes the apparatus of any of examples 15-17, or some other example herein, wherein the third axis is a Polarization axis.

Example 27 includes the apparatus of any of examples 15-17, or some other example herein, wherein the platform portion is adjustable such that an element of the platform portion that is to attach to the DUT is movable along a third axis that is perpendicular to the first and second axes.

Example 28 includes one or more non-transitory computer-readable media comprising instructions that, upon execution of the instructions by one or more processors of an electronic device, are to cause the electronic device to: rotate, via rotation of an element of a base portion of a testing apparatus, a device-under-test (DUT) around a first axis; rotate, via rotation of an element of an arm portion of the testing apparatus, the DUT around a second axis that is perpendicular to the first axis; and rotate, via rotation of an element of a platform portion of the testing apparatus, the DUT around a third axis that is perpendicular to the first and second axes.

Example 29 includes the one or more non-transitory computer-readable media of example 28, or some other example herein, wherein the first axis is an Azimuth axis and the second axis is an Elevation axis.

Example 30 includes the one or more non-transitory computer-readable media of example 28, or some other example herein, wherein the arm portion is coupled with the base portion and the platform portion such that the platform portion is coupled with the base portion via the arm portion.

Example 31 includes the one or more non-transitory computer-readable media of any of examples 28-30, or some other example herein, wherein the arm portion has a width that is selectively adjustable.

Example 32 includes the one or more non-transitory computer-readable media of example 31, or some other example herein, wherein the width of the arm portion is adjustable based on the insertion or removal of a spacer between elements of the arm portion.

Example 33 includes the one or more non-transitory computer-readable media of example 32, or some other example herein, wherein the spacer includes a passthrough hole configured to allow a wire that is to be communicatively coupled to the DUT to pass through from one side of the spacer to another side of the spacer.

Example 34 includes the one or more non-transitory computer-readable media of any of examples 28-30, or some other example herein, wherein an element of the arm portion includes a passthrough hole configured to allow a wire that is to be communicatively coupled to the DUT to pass through from one side of the element of the arm portion to another side of the element of the arm portion.

Example 35 includes the one or more non-transitory computer-readable media of any of examples 28-30, or some other example herein, wherein an element of the platform portion includes a passthrough hole configured to allow a wire that is to be communicatively coupled to the DUT to pass through from one side of the element of the platform portion to another side of the element of the platform portion.

Example 36 includes the one or more non-transitory computer-readable media of example 35, or some other example herein, wherein the passthrough hole is adjacent to an area where the arm portion is coupled with the platform portion.

Example 37 includes the one or more non-transitory computer-readable media of any of examples 28-30, or some other example herein, wherein the platform portion includes an attachment plate that is to couple to the DUT.

Example 38 includes the one or more non-transitory computer-readable media of example 37, or some other example herein, wherein the attachment plate includes an actuator that is to rotate the DUT around the third axis.

Example 39 includes the one or more non-transitory computer-readable media of any of examples 28-30, or some other example herein, wherein the third axis is a Polarization axis.

Example 40 includes the one or more non-transitory computer-readable media of any of examples 28-30, or some other example herein, wherein the platform portion is adjustable such that an element of the platform portion that is to attach to the DUT is movable along a third axis that is perpendicular to the first and second axes.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications, and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within the purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

The invention claimed is:

1. A testing apparatus for coupling with a device-under-test (DUT), wherein the apparatus comprises:
   a base portion configured to couple to a surface wherein the base portion is configured to rotate the DUT around a first axis;
   an arm portion coupled with the base portion, wherein the arm portion is configured to rotate the DUT around a second axis perpendicular to the first axis; and
   a platform portion coupled to the arm portion, wherein the platform portion is configured to couple to the DUT such that at least a portion of the DUT remains approximately at an intersection of the first and second axes;
   wherein a width of the arm portion is selectively adjustable based on a size of the DUT, and wherein the width of the arm portion is measured in a direction parallel to the second axis.

2. The testing apparatus of claim 1, wherein the width of the arm portion is adjustable based on the insertion or removal of a spacer between elements of the arm portion.

3. The testing apparatus of claim 2, wherein the spacer includes a passthrough hole configured to allow a wire that is to be communicatively coupled to the DUT to pass through from one side of the spacer to another side of the spacer.

4. The testing apparatus of claim 1, wherein an element of the platform portion includes a passthrough hole configured to allow a wire that is to be communicatively coupled to the DUT to pass through from one side of the element of the platform portion to another side of the element of the platform portion.

5. The testing apparatus of claim 4, wherein the passthrough hole is adjacent to an area where the arm portion is coupled with the platform portion.

6. The testing apparatus of claim 1, wherein the platform portion includes an attachment plate that is to couple to the DUT.

7. The testing apparatus of claim 6, wherein the attachment plate includes an actuator that is to rotate the DUT around a third axis that is perpendicular to the first and second axes.

8. The testing apparatus of claim 1, wherein the platform portion is adjustable such that an element of the platform portion that is to attach to the DUT is movable along a third axis that is perpendicular to the first and second axes.

9. An apparatus comprising:
a testing platform; and
a testing apparatus to couple to a device-under-test (DUT) that includes a millimeter-wave (mmWave) antenna or a terahertz (THz)-frequency antenna, wherein the apparatus comprises:
 a base portion coupled to the testing platform, wherein the base portion is configured to rotate the DUT around an Azimuth axis;
 an arm portion coupled to the base portion, wherein the arm portion has a width that is selectively adjustable based on a size of the DUT, wherein the width is measured parallel to an Elevation axis that is perpendicular to the Azimuth axis, and wherein the arm portion is configured to rotate the DUT around the Elevation axis; and
 a platform portion coupled with the base portion, wherein the platform portion is configured to couple to the DUT, wherein the platform portion is configured to rotate the DUT around a Polarization axis that is perpendicular to the Elevation axis and the Azimuth axis, wherein the Polarization axis is coincident with an axis of radiation of the DUT, and wherein the platform portion is adjustable such that an element of the platform portion that is to attach to the DUT is movable along the Polarization axis.

10. The apparatus of claim 9, wherein an element of the arm portion includes a passthrough hole configured to allow a wire that is to be communicatively coupled to the DUT to pass through from one side of the element of the arm portion to another side of the element of the arm portion.

11. The apparatus of claim 9, wherein an element of the platform portion includes a passthrough hole configured to allow a wire that is to be communicatively coupled to the DUT to pass through from one side of the element of the platform portion to another side of the element of the platform portion.

12. The apparatus of claim 9, wherein the platform portion includes an attachment plate that is to couple to the DUT.

13. A testing apparatus for coupling with a device-under-test (DUT), wherein the apparatus comprises:
 a base portion configured to couple to a surface, wherein the base portion is configured to rotate the DUT around a first axis;
 an arm portion coupled to the base portion, the arm portion configured to rotate the DUT around a second axis perpendicular to the first axis; and
 a platform portion coupled to the arm portion, the platform portion configured to couple to the DUT and rotate the DUT around a third axis that is perpendicular to the first and second axis and coincident with the axis of radiation of the DUT, and wherein the platform portion is adjustable such that an element of the platform portion that is to attach to the DUT is movable along the third axis.

14. The testing apparatus of claim 13, wherein the arm portion has a selectively adjustable width as measured in a direction parallel to the second axis, and wherein the width is adjustable based on a size of the DUT.

15. The testing apparatus of claim 13, wherein the width of the arm portion is adjustable based on the insertion or removal of a shim between an element of the arm portion and the platform portion.

16. The testing apparatus of claim 13, wherein an element of the platform portion includes a passthrough hole configured to allow a wire that is to be communicatively coupled to the DUT to pass through from one side of the element of the platform portion to another side of the element of the platform portion.

17. The testing apparatus of claim 13, wherein the platform portion includes an attachment plate that is to couple to the DUT.

* * * * *